(12) United States Patent
Herr et al.

(10) Patent No.: US 9,905,900 B2
(45) Date of Patent: Feb. 27, 2018

(54) SUPERCONDUCTOR CIRCUITS WITH ACTIVE TERMINATION

(71) Applicants: Quentin P. Herr, Ellicott City, MD (US); Aaron A. Pesetski, Gambrills, MD (US); Pavel Borodulin, Baltimore, MD (US)

(72) Inventors: Quentin P. Herr, Ellicott City, MD (US); Aaron A. Pesetski, Gambrills, MD (US); Pavel Borodulin, Baltimore, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 383 days.

(21) Appl. No.: 14/702,044

(22) Filed: May 1, 2015

(65) Prior Publication Data
US 2016/0322689 A1 Nov. 3, 2016

(51) Int. Cl.
  *H03K 19/195* (2006.01)
  *H01P 3/06* (2006.01)
  *H03K 3/38* (2006.01)

(52) U.S. Cl.
  CPC .............. *H01P 3/06* (2013.01); *H03K 3/38* (2013.01); *H03K 19/195* (2013.01)

(58) Field of Classification Search
  CPC ........... H01P 3/06; H03K 3/38; H03K 19/195
  See application file for complete search history.

(56) References Cited

U.S. PATENT DOCUMENTS

| | | | | | |
|---|---|---|---|---|---|
| 4,504,718 | A | * | 3/1985 | Okatsuka | H05B 6/642 219/717 |
| 4,588,962 | A | * | 5/1986 | Saito | H01P 5/12 330/286 |
| 6,297,696 | B1 | * | 10/2001 | Abdollahian | H03F 3/602 330/124 R |
| 6,486,756 | B2 | * | 11/2002 | Tarutani | H01L 27/18 257/E27.007 |
| 7,129,869 | B2 | * | 10/2006 | Furuta | G11C 7/06 341/126 |

(Continued)

OTHER PUBLICATIONS

Oberg, Oliver T., et al. "Integrated power divider for superconducting digital circuits." *IEEE Transactions on Applied Superconductivity* 21.3 (2011): 571-574.; p. 571, right-hand column , paragraph 4; figure 1 p. 572, left-hand column, paragraph 4; figure 2, figure 6.

(Continued)

*Primary Examiner* — Alexander H Taningco
*Assistant Examiner* — Kurtis R Bahr
(74) *Attorney, Agent, or Firm* — Tarolli, Sundheim, Covell & Tummino LLP

(57) ABSTRACT

A microwave circuit is provided that comprises a plurality of transmission lines each configured to receive and propagate a respective waveform signal of a plurality of waveform signals, and a combiner that receives and combines the plurality of waveform signals from outputs of the plurality of transmission lines into a combined output waveform signal that is output terminated by an output termination resistor. The microwave circuit further comprises a compensation signal generator that generates a compensation signal to mitigate reflections associated with the transmission of signals through the microwave circuit.

19 Claims, 4 Drawing Sheets

$Ae^{j\omega t} + Be^{-j\omega t} - Be^{-j\omega t}$

(56) References Cited

U.S. PATENT DOCUMENTS

| | | | | |
|---|---|---|---|---|
| 7,786,748 B1* | 8/2010 | Herr | ................... | H03K 19/1952 |
| | | | | 326/3 |
| 8,076,975 B1* | 12/2011 | Lender, Jr. | .............. | H03F 3/607 |
| | | | | 330/286 |
| 8,508,280 B2* | 8/2013 | Naaman | ................... | H03K 3/38 |
| | | | | 326/3 |
| 8,571,614 B1* | 10/2013 | Mukhanov | .............. | H01L 27/18 |
| | | | | 174/250 |
| 9,203,361 B2* | 12/2015 | Åkesson | ................ | H01P 7/082 |
| 2001/0025012 A1 | 9/2001 | Tarutani et al. | | |
| 2015/0263736 A1* | 9/2015 | Herr | ........................ | H03K 3/38 |
| | | | | 326/4 |

OTHER PUBLICATIONS

International Search Report for corresponding PCT/US2016/028456 dated Jul. 18, 2016.

\* cited by examiner $$Ae^{i\omega t} + Be^{-i\omega t}$$

SUPERCONDUCTOR CIRCUITS WITH ACTIVE TERMINATION

TECHNICAL FIELD

The present invention relates generally to superconducting circuits, and more particularly to superconductor circuits with active termination.

BACKGROUND

Signal reflection occurs when a signal is transmitted along a transmission medium, such as a copper cable or an optical fiber. Some of the signal power may be reflected back to its origin rather than being carried all the way along the cable to the far end. This happens because imperfections in the cable transitions cause impedance mismatches and non-linear changes in the cable characteristics. These abrupt changes in characteristics cause some of the transmitted signal to be reflected. The ratio of energy bounced back depends on the impedance mismatch. Impedance discontinuities cause attenuation, attenuation distortion, standing waves, ringing and other effects because a portion of a transmitted signal will be reflected back to the transmitting device rather than continuing to the receiver, much like an echo. This effect is compounded if multiple discontinuities cause additional portions of the remaining signal to be reflected back to the transmitter. This is a fundamental problem with the daisy chain method of connecting electronic components.

Superconducting microwave circuits have similar problems caused by circuit discontinuities and in particular when propagating signals between conventional circuits residing in room temperatures and superconducting circuits residing in superconducting cooled cryogenic temperatures (e.g., 4° K), referred to as 'cold space'. That is couplings of the circuits and splitting and combining of microwave signals result in impedance mismatches due to the circuit transitions, and as a result cause signal reflections of AC propagated signals that distort the original AC signal (e.g., clock signal) from propagating through the microwave circuit. Some attempts have been made to provide for impedance matching of microwave signal paths that have their disadvantages.

For example, FIG. 1 illustrates one conventional microwave circuit 10 having a superconducting circuit 12 that employs an AC source ($V_{AC}$) to provide an AC input signal to the superconducting circuit 12. The AC source $V_{AC}$ is source terminated by an input termination resistor $R_{TIN}$. Both the input termination resistor $R_{TIN}$ and the AC source $V_{AC}$ reside in a room temperature environment coupled to the superconducting circuit 12 via, for example, a coaxial cable. The superconducting circuit 12 resides in a cold space 16, such as a supercooled cryogenic refrigerator. The superconducting circuit 12 includes a power splitter 14 that splits the AC input signal into eight AC intermediate signals that propagate through the superconducting circuit via superconducting transmission lines 18. Each of the eight superconducting transmission lines are terminated by a respective termination resistor ($R_{TOUT1}$ through $R_{TOUT8}$) that also resides in the cold space 16. The problem with this configuration is that the termination resistors $R_{TOUT1}$ through $R_{TOUT8}$ dissipate power into the cold space, and it takes a great deal more power than the dissipated power to maintain the supercooled cryogenic temperatures in the cold space as a result of the power dissipated by the termination resistors $R_{TOUT1}$ through $R_{TOUT8}$. For example, it may take up to 1000 watts of power to keep the cold space at the selected cryogenic temperature for a power dissipation of a single watt in the cold space.

FIG. 2 illustrates another microwave circuit 30 having a superconducting circuit package 32 with a single output termination resistor $R_{TOUT}$ at room temperature. The superconducting circuit package 32 includes a splitter 34, a Reciprocal Quantum Logic (RQL) circuit 36 having a plurality of superconducting transmission lines 40 and other superconducting circuitry (e.g., bias inductors), and a power combiner 38 residing on superconducting circuit package 32. The superconducting circuit package 32 can be a printed circuit board that resides in a cold space. An AC source ($V_{AC}$) is terminated by an input resistor ($R_{TIN}$), which both reside at room temperature. The AC source $V_{AC}$ provides an AC input signal to the power splitter 34 that splits the AC input signal into a plurality of AC intermediate signals that are applied to inputs of corresponding superconducting transmission lines 40 of the RQL circuit 36. The plurality of AC intermediate signals propagate through the plurality of superconducting transmission lines 40 to respective outputs coupled to inputs of the power combiner 38. The power combiner 38 combines the plurality of AC intermediate signals into a single combined AC output signal to be terminated by an output termination resistor ($R_{TOUT}$) that resides outside the cold space in room temperature.

However, the transitions from the AC input source $V_{AC}$ to the power splitter 34, transitions from the superconducting transmission lines to the power combiner 38, and transitions from the power combiner 38 to the output termination resistor $R_{TOUT}$ may cause reflections in the superconducting circuit. In particular, the reflections from the transitions to and from the power combiner 38 as shown by the dashed lines cause standing waves in the RQL circuit 36. The standing waves consist of the desired forward traveling wave of amplitude A, and the undesired backward traveling wave of amplitude B, as shown in the equation of the AC input signal, $Ae^{i\omega t}+ Be^{-i\omega t}$. The standing waves directly decrease operating margins in the superconducting circuit package 32.

SUMMARY

In one example, a microwave circuit is provided that comprises a plurality of transmission lines each configured to receive and propagate a respective waveform signal of a plurality of waveform signals, and a combiner that receives and combines the plurality of waveform signals from outputs of the plurality of transmission lines into a combined output waveform signal that is output terminated by an output termination resistor. The microwave circuit further comprises a compensation signal generator that generates a compensation signal to mitigate reflections associated with the transmission of signals through the microwave circuit.

In another example, a microwave circuit is provided that comprises an AC source that generates an AC input signal, and a superconducting circuit that resides in a cold space that is maintained at superconducting cryogenic temperatures. The superconducting circuit comprises a splitter for splitting the AC input signal into a plurality of AC intermediate signals, a plurality of transmission lines each configured to receive and propagate a respective AC intermediate signal of the plurality of AC intermediate signals, a set of reciprocal quantum logic (RQL) circuits coupled to a transmission line for each of the plurality of transmission lines, and a combiner that receives and combines the plurality of AC intermediate signals from outputs of the plurality of transmission lines into a combined AC output signal. The microwave circuit further comprises an output source terminated compensation signal generator that generates a compensation signal to mitigate reflections associated with the transmission of signals through the superconducting circuit.

In yet another example, a method of compensating for discontinuities in a microwave circuit is disclosed. The method comprises applying a waveform signal to a superconducting circuit, and providing a compensation signal to the superconducting circuit to mitigate reflections associated with the transmission of signals associated with the waveform signal through the microwave circuit.

DETAILED DESCRIPTION

Figure 1:
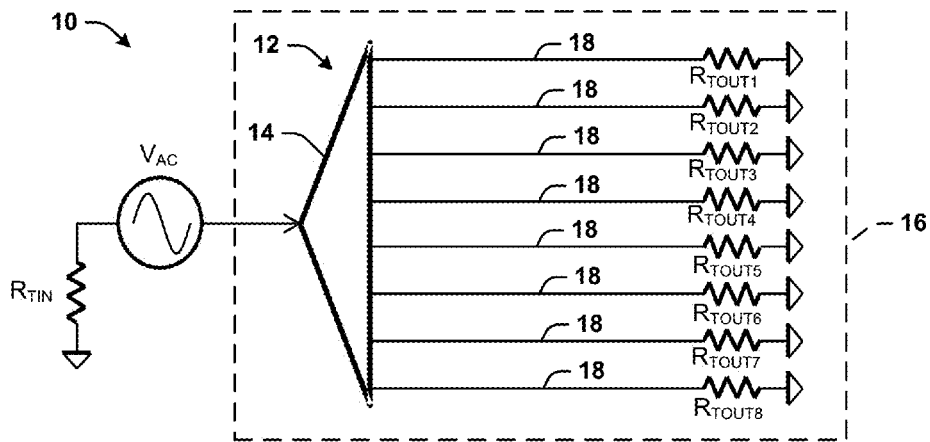
FIG. 1 illustrates one conventional microwave circuit having a superconducting circuit that receives an AC input signal.
Figure 2:
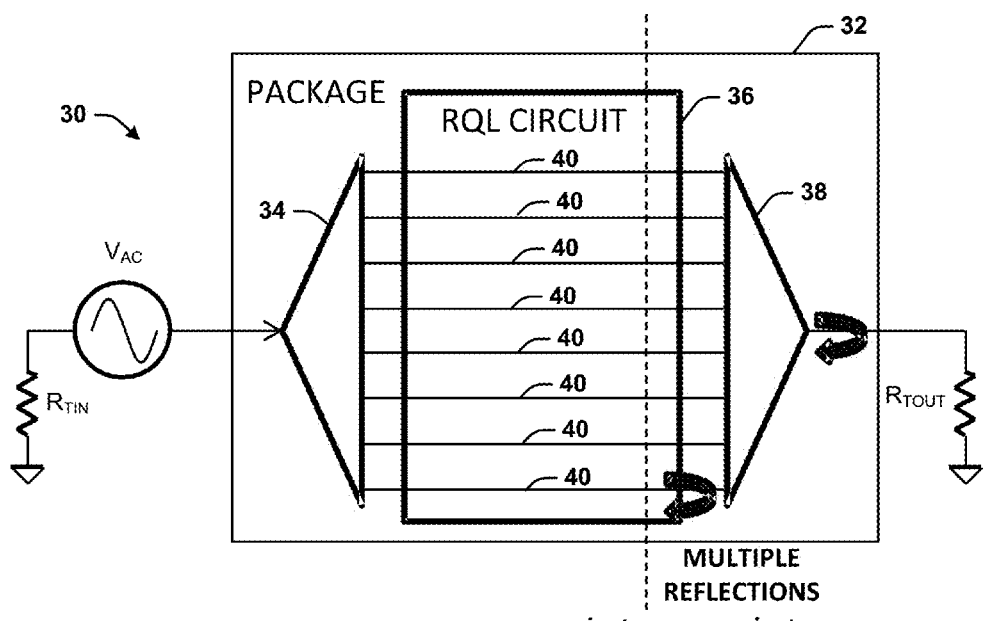
FIG. 2 illustrates another conventional microwave circuit having a superconducting circuit that receives an AC input signal.

A microwave circuit is provided that includes a superconducting circuit that resides in a cold space and receives a first waveform signal (e.g., AC input signal) from outside the cold space. A cold space is defined as a confined chamber with a temperature that provides the ability of certain metals or alloys to conduct an electric current with almost no resistance, referred to as superconductivity. Superconductivity usually occurs close to absolute zero, at temperatures approaching −459.67° F. (−273.15° C.), but has also been observed at temperatures as high as −200° F. (−128.88° C.). For example, one particular temperature is 4° Kelvin (−269.15° C.). The first waveform signal is propagated through the superconducting circuit to a termination resistor that resides outside the cold space, for example, in a room temperature environment. The first waveform signal can be, for example, a clock signal associated with providing clocking signals and power to a superconducting circuit, such as Reciprocal Quantum Logic (RQL) circuits.

RQL circuits are a new kind of superconducting logic microwave circuit, which attempts to fix some of the problems of rapid single flux quantum logic utilizing reciprocal pairs of quantized single magnetic flux pulses to encode classical logic bits. Data encoding in RQL is done using integer units of the magnetic flux quantum. RQL gates require no bias resistors to operate and this allows them to dissipate several orders of magnitude less power than previous superconducting logic families.

Proper termination of microwave circuits generally involves a matched resistive load that dissipates power. In the context of microwave clock distribution in RQL circuits, it is desirable to have the termination resistor at room temperature, not at the cryogenic operating temperature of the circuit. Thus, the power generated at room temperature, is delivered to the cryogenic circuit, and then returns to room temperature. The problem with room-temperature termination is that the package transitions need to be seamless to assure matched impedance throughout the overall circuit. Even a −20 dB reflection in the package will produce a 1.2:1 VSWR (voltage standing wave ratio), on the clock line which will significantly reduce the operating margins of the circuit. Reflections of −30 dB or less are desirable but require near-perfection in the transistions at the package.

The termination resistor is meant to provide for a matched impedance output for the superconducting circuit to mitigate signal distortion associated with unmatched impedance throughout the circuit. Unmatched impedance is typically caused by transitions in the circuit, such as those associated with connections in the circuit between circuit components that reside in the room temperature space and circuit components that reside in the cold space. Other transitions that cause unmatched impedance problems can include signal splitters and combiners that are employed to make a plurality of waveform signals from the first waveform signal and terminate the plurality of waveform signals into a single output waveform for termination by a single termination resistor.

The transitions throughout the circuit result in reflections (i.e., standing waves), in the original signals (i.e., forward traveling wave), that propagate back toward the first waveform signal and combine with the first waveform signal, the plurality of waveform signals and the single output waveform to create signal distortion in these respective signals. In accordance with an example herein, a compensation signal is provided at an end associated with the output termination resistor and tuned to mitigate reflections caused by one or more transitions in the microwave circuit. The compensation signal can be an inverted signal copy of the signal reflections and combined with the signal reflections to essentially eliminate the signal reflections and provide substantially distortion free forward traveling waveform signals.

In one example, actively applying a waveform to a RQL clock return line that is equal and opposite to the reflections can substantially cancel out the reflections through the overall RQL circuit. This technique is effective even for many large reflections in an RQL integrated circuit package. The only requirement is that the transmission lines of the RQL circuit(s) be free of discontinuities in the superconductor space where the logic circuit is located. This is readily achieved due to the near-ideal microwave characteristics of superconductor circuits.

Figure 3:
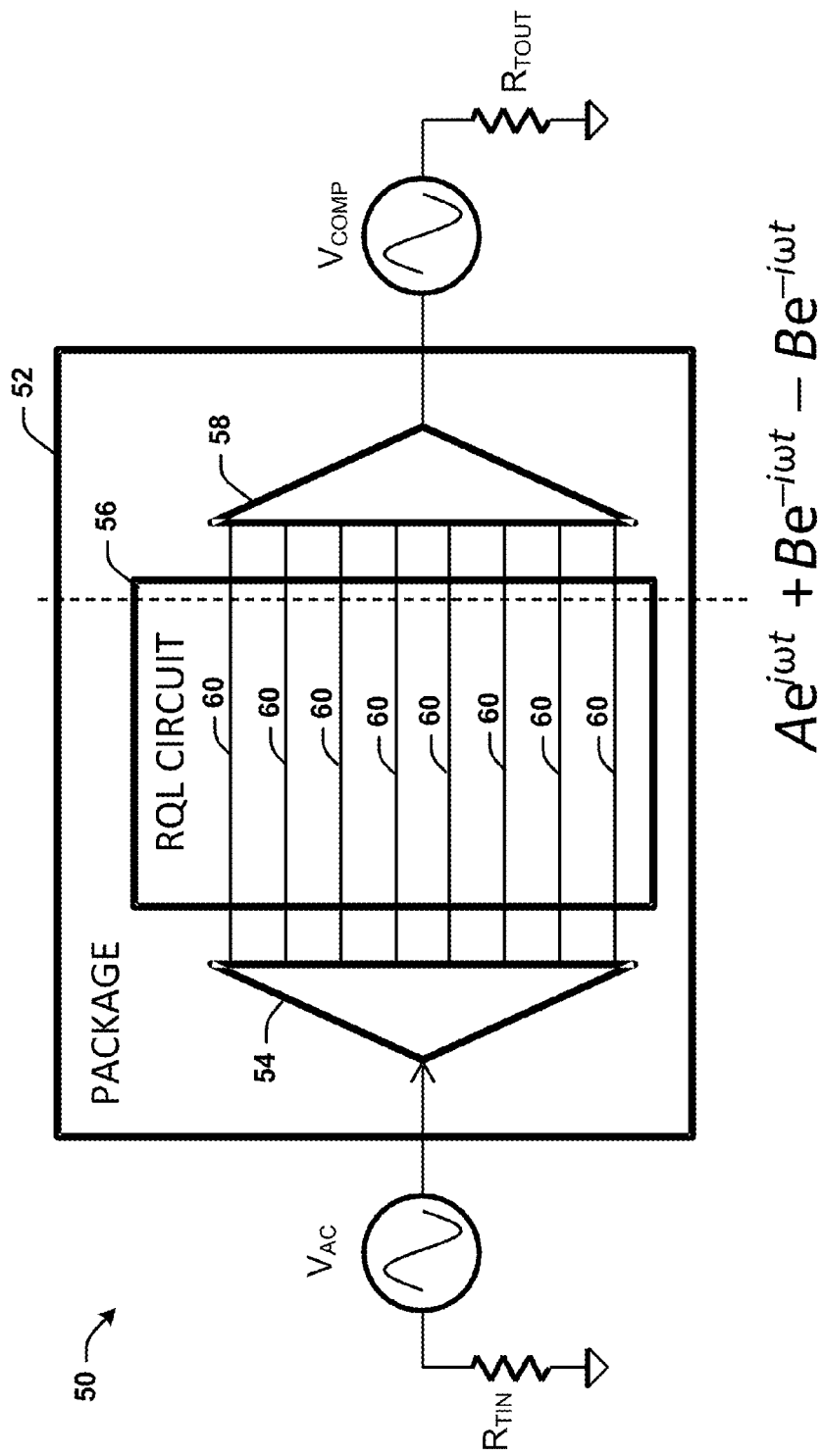
FIG. 3 illustrates an example of a microwave circuit that provides for the generation of a compensation signal for mitigating the effects of reflections in the microwave circuit.

FIG. 3 illustrates an example of a microwave circuit 50 that provides for the generation of a compensation signal for mitigating the effects of reflections in the microwave circuit 50. The microwave circuit 50 includes a superconducting circuit package 52 that receives an AC input signal from an AC input source ($V_{AC}$). The superconducting circuit package 52 includes a power splitter 54, a RQL circuit 56 having a plurality of superconducting transmission lines 60 and other superconducting circuitry (e.g., bias inductors), and a power combiner 58. The superconducting circuit package 52 can be a printed circuit board that resides in a cold space that maintains the superconducting circuit package 52 at cryogenic temperatures as stated above. The AC source $V_{AC}$ is terminated by an input termination resistor $R_{TIN}$, which both reside outside the cold space, for example, in a room temperature environment It is not a requirement to source terminate the AC source $V_{AC}$.

The AC source $V_{AC}$ provides an AC input signal to an input of the power splitter 54 that splits the AC input signal into a plurality of AC intermediate signals that are applied to inputs of corresponding superconducting transmission lines 60 of the RQL circuit 56. The AC input signal can be a clock input that provides both power and clocking functions to the RQL circuit 56. The plurality of AC intermediate signals propagate through respective transmission lines of the plurality of transmission lines 60 to respective outputs coupled to inputs of a power combiner 58. The power combiner 58 combines the plurality of AC intermediate signals into a single combined AC output signal to be terminated by an output termination resistor ($R_{TOUT}$) that resides outside the cold space in, for example, a room temperature environment.

However, reflections from the transitions from the AC input source $V_{AC}$ to the power splitter 54, reflections from the superconducting transmission lines 60 to the power combiner 58 and reflections from the power combiner 58 to the output termination resistor $R_{TOUT}$ cause reflections. In particular, the reflections from the power combiner 58, as shown by the dashed lines, cause standing waves in the RQL circuit 56, which directly decreases operating margins in the RQL circuit 56. The standing wave consists of the desired forward traveling wave of amplitude A, and the undesired backward traveling wave of amplitude B, as shown in the equation of the AC input signal at the dashed line location of the superconducting transmission lines 60 of the RQL circuit 56, $Ae^{i\omega t}+Be^{-i\omega t}$.

A second waveform generator ($V_{comp}$) is provided that is coupled in series with the output termination resistor ($R_{TOUT}$). The second waveform generator $V_{COMP}$ can be used to produce a compensation signal that is equal and opposite to the reflections in the RQL circuit 56, with correct adjustment of phase and amplitude. For example, the second waveform generator $V_{COMP}$ can produce a compensation signal of amplitude –B, such that the total signal is equal to $Ae^{i\omega t}+Be^{i\omega t}-Be^{i\omega t}$, such that the second and third terms cancel, thus cancelling the reflections in the RQL circuit 56. The compensation signal can be a waveform that is at the same frequency as the AC input signal, and has an amplitude that is estimated to be an inverted version of a total sum of all signal reflections associated with transitions within and outside the superconducting circuit. This produces substantially perfect traveling waves through the RQL circuit 56 irrespective of the number and size of discontinuities in the transitions in the microwave circuits 50. The only requirement is that there are no discontinuities in the region of the active RQL circuit 58 itself.

Figure 4:
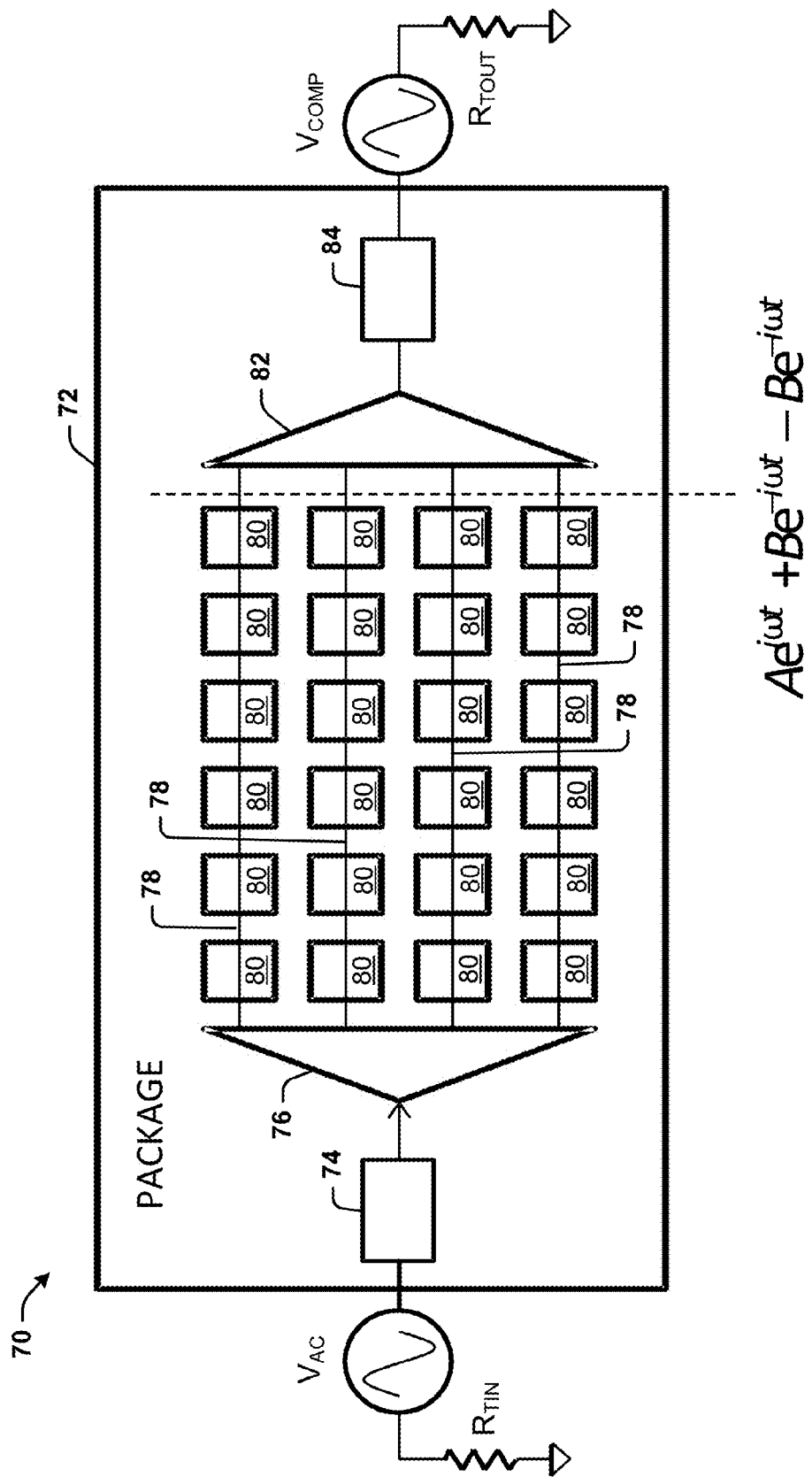
FIG. 4 illustrates an example of another microwave circuit that provides for the generation of a compensation signal for mitigating the effects of reflections in the microwave circuit.

FIG. 4 illustrates another example of a microwave circuit 70 that provides for the generation of a compensation signal for mitigating the effects of reflections in the microwave circuit 70. The microwave circuit 70 includes a superconducting circuit package 72 that resides in a cold space and an AC source ($V_{AC}$) coupled to an input of the superconducting circuit package 72. The AC source $V_{AC}$ resides outside the cold space, for example in a room temperature environment, and provides an AC input signal (e.g., a clock signal) to an input of the superconducting circuit package 72. The AC source $V_{AC}$ is source terminated by an input termination resistor $R_{TIN}$. It is not a requirement to source terminate the AC source $V_{AC}$. The superconducting circuit package 72 includes an input coaxial cable 74 that receives the AC input signal $V_{AC}$ and provides it to a power splitter 76 that generates a plurality of AC intermediate input signals each being propagated along respective superconducting transmission lines of a plurality of superconducting transmission lines 78.

The superconducting circuit package 72 includes a plurality of RQL circuits 80 (e.g., RQL integrated circuits). A set of the plurality of RQL circuits are coupled to corresponding superconducting transmission lines, such that an AC intermediate input signal can be provided to a different set of RQL circuits 80. Each of the RQL circuits 80 can also have one or more superconducting transmission lines and other superconducting circuitry (e.g., bias inductors), such that the corresponding AC intermediate input signal can be employed as a clock and power for that particular RQL circuit 80. The superconducting circuit package 72 also includes a power combiner 82 that includes inputs for receiving output of the plurality of superconducting transmission lines 78. The power combiner 82 combines the plurality of AC intermediate signals into a single combined AC output signal that is provided to an output coaxial cable 84 on the superconducting circuit package 72. An output of the output coaxial cable 84 is provided to an output termination resistor $R_{TOUT}$ that resides outside the cold space in, for example, a room temperature environment.

A second waveform generator ($V_{comp}$) is provided that is coupled in series with the output termination resistor $R_{TOUT}$. The second waveform generator $V_{COMP}$ can be used to produce a compensation signal that is equal and opposite to the reflections produced in the RQL circuits 80, with correct adjustment of phase and amplitude. For example, the second waveform generator $V_{COMP}$ can produce a compensation signal of amplitude –B, such that the total signal is equal to $Ae^{i\omega t}+Be^{i\omega t}-Be^{i\omega t}$, such that the second and third terms cancel, thus cancelling the reflections in the RQL circuit 80. The compensation signal can be an AC waveform that is at the same frequency as the AC input signal, and has an amplitude that is estimated to be an inverted version of a total sum of all signal reflections associated with transitions within and outside the superconducting circuit. This produces substantially perfect traveling waves through the RQL circuit 80 irrespective of the number and size of discontinuities in the transitions in the superconducting circuit package 72 and in the microwave components. The only requirement is that there are no discontinuities in the region of the active circuits.

The example shown in FIG. 4 involves a transition from a coaxial cable to stripline, a power splitter that may be multiple levels deep and include a Hybrid to generate I & Q waveforms from a single input, and many RQL integrated circuits which may be mounted on multiple printed circuit boards. Again, traveling waves can be produced using a single source at the output to cancel reflections, with the only requirement that there are no discontinuities in the region of the active circuits.

Figure 5:
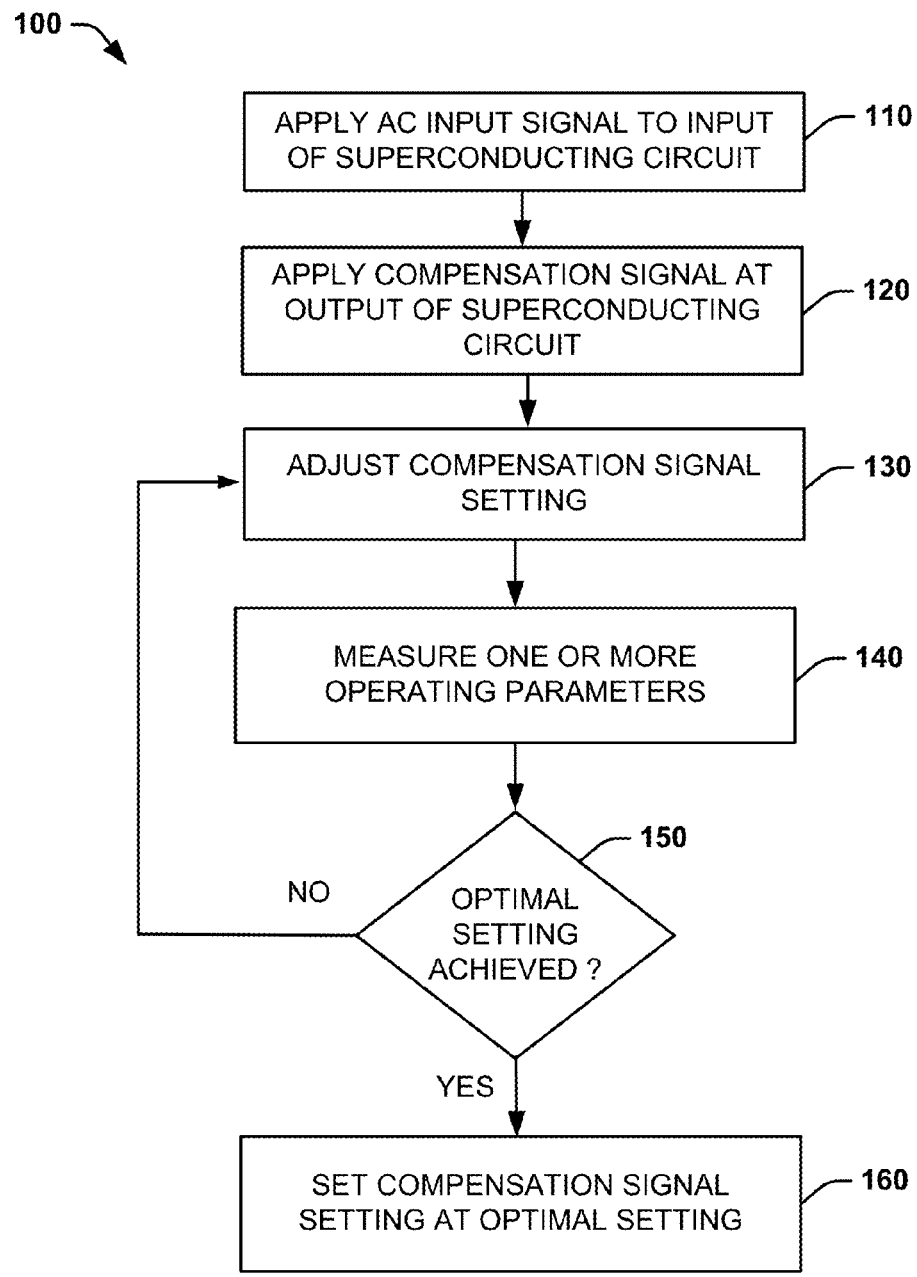
FIG. 5 illustrates a flow diagram of a method of compensating for discontinuities in a microwave circuit.

In view of the foregoing structural and functional features described above, an example methodology will be better appreciated with reference to FIG. 5. While, for purposes of simplicity of explanation, the methodology of FIG. 5 is shown and described as executing serially, it is to be understood and appreciated that the present invention is not limited by the illustrated order, as some actions could in other examples occur in different orders and/or concurrently from that shown and described herein.

FIG. 5 illustrates a flow diagram of a method of compensating for discontinuities in a microwave circuit. The method begins at 110 where an AC input signal is applied to an input of a superconducting circuit, such as the superconducting circuits illustrated in FIG. 3 or FIG. 4. The superconducting circuit resides in a cold space and can include a power splitter that splits the AC input signal into a plurality of AC intermediate inputs signals over a plurality of superconducting transmission lines, such as those that provide clocking and power to one or more RQL circuits. The superconducting circuit can also include a power combiner that combines the plurality of AC intermediate inputs signals from the outputs of the plurality of superconducting transmission lines to a single AC output that is provided at the output of the superconducting circuit and terminated by a termination resistor that resides outside the cold space in, for example, a room temperature environment. The methodology then proceeds to 120.

At 120, a compensation signal is applied at the output of the superconducting circuit. The compensation signal can be an AC waveform that is at the same frequency as the AC input signal, and has an amplitude that is estimated to be an inverted version of a total sum of all signal reflections associated with transitions within and outside the superconducting circuit. The methodology then proceeds to adjust the compensation signal setting at 130, for example, by providing an initial amplitude of the compensation signal. The methodology then proceeds to 140 to measure one or more operating parameters associated with the operation of the superconducting circuit. For example, measurements can be made at different points on the superconducting circuit to determine if the plurality of AC intermediate signals have similar amplitudes at different physical locations on the superconducting circuit. Alternatively, the functional operation of the superconducting circuit could be verified by applying stimulus to the superconducting circuit and looking at outputs of the superconducting circuit to verify functional operations or failure of operations that may be a result of reflections. It is to be appreciated that a variety of techniques can be employed to determine the operating margins of the one or more operating parameters of the superconducting circuit.

The methodology then proceeds to 150 to determine whether or not the optimal setting of the compensation signal has been achieved. If the optimal setting of the compensation signal has been achieved (YES), then the methodology proceeds to 160 to set the compensation signal at the optimal setting for normal operations of the superconducting circuit. If the optimal setting of the compensation signal has not been achieved (NO), the methodology returns to 130 to adjust the compensation signal setting. The methodology then repeats the measuring of one or more parameters at 140 and the determining if the optimal setting has been achieved at 150, until an optimal setting has been achieved. For example, the compensation signal setting can be the amplitude of the compensation signal which can be increased as the operating margins of the superconducting circuit increase, until the operating margins begin to decease. The amplitude of the compensation signal can be set to its original value and decreased to determine if the operating margins of the superconducting circuit increase, until the operating margins begin to decease again upon decreasing amplitude. The amplitude that provides for the most desirable operating margins can be determined as the optimal setting, and thus the value used for normal operations of the superconducting circuit.

What have been described above are examples. It is, of course, not possible to describe every conceivable combination of structures, components, or methods, but one of ordinary skill in the art will recognize that many further combinations and permutations are possible. Accordingly, the invention is intended to embrace all such alterations, modifications, and variations that fall within the scope of this application, including the appended claims. Where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A microwave circuit comprising:
    a plurality of transmission lines each configured to receive and propagate a respective waveform signal of a plurality of waveform signals, wherein the plurality of transmission lines operate in a superconducting circuit;
    a combiner that receives and combines the plurality of waveform signals from outputs of the plurality of transmission lines into a combined output waveform signal that is output terminated by an output termination, wherein the combiner operates in the superconducting circuit; and
    a compensation signal generator that generates a compensation signal to mitigate reflections associated with the transmission of signals through the microwave circuit, wherein the compensation signal is an inverted version of a sum of the total reflections in the microwave circuit.

2. The circuit of claim 1, further comprising a waveform generator that generates a first waveform signal and a splitter for splitting the first waveform signal into the plurality of waveform signals to be provided to the plurality of transmission lines.

3. The circuit of claim 2, wherein the splitter, the plurality of transmission lines, and the combiner form the superconducting circuit that resides in a cold space with a temperature environment that is at superconducting cryogenic temperatures and the waveform generator and the compensation generator resides outside the cold space in a room temperature environment.

4. The circuit of claim 2, further comprising a first coaxial cable coupled between the waveform generator and the power splitter and a second coaxial cable coupled between the combiner and the compensation signal generator.

5. The circuit of claim 2, wherein the waveform generator is an AC source that provides an AC input signal at a predetermined frequency and the compensation signal generator is an AC source that provides an AC compensation signal at the same predetermined frequency.

6. The circuit of claim 2, wherein the waveform generator is terminated by an input termination resistor.

7. The circuit of claim 1, wherein the plurality of transmission lines are each configured to provide waveform signals to one or more reciprocal quantum logic (RQL) circuits.

8. The circuit of claim 7, wherein the plurality of waveform signals provide power and a clocking function to the RQL circuits.

9. The circuit of claim 7, wherein the RQL circuits comprise a plurality of integrated RQL circuits associated with each of the plurality of transmission lines.

10. A microwave circuit comprising:
    an AC source that generates an AC input signal;
    a superconducting circuit that resides in a cold space that is maintained at superconducting cryogenic temperatures, the superconducting circuit comprising:
    a splitter for splitting the AC input signal into a plurality of AC intermediate signals;
    a plurality of transmission lines each configured to receive and propagate a respective AC intermediate signal of the plurality of AC intermediate signals;
    a set of reciprocal quantum logic (RQL) circuits coupled to a transmission line for each of the plurality of transmission lines;

a combiner that receives and combines the plurality of AC intermediate signals from outputs of the plurality of transmission lines into a combined AC output signal; and an output source terminated compensation signal generator that generates a compensation signal to mitigate reflections associated with the transmission of signals through the superconducting circuit, wherein the compensation signal is an inverted version of a sum of the total reflections in the microwave circuit.

11. The circuit of claim 10, wherein the plurality of AC intermediate waveform signals provide power and a clocking functions to the RQL circuits.

12. The circuit of claim 10, wherein the RQL circuits comprise a plurality of integrated RQL circuits.

13. The circuit of claim 10, wherein the superconducting circuit further comprises a first coaxial cable coupled between the waveform generator and the power splitter and a second coaxial cable coupled between the power combiner and the second waveform generator.

14. The circuit of claim 10, wherein the superconducting circuit resides on a printed circuit board as one or more components.

15. A method of compensating for discontinuities in a microwave circuit, the method comprising:
applying a waveform signal to a superconducting circuit; and
applying a compensation signal to the superconducting circuit to mitigate reflections associated with the transmission of signals associated with the waveform signal through the microwave circuit, wherein the compensation signal is an inverted version of a sum of the total reflections in the microwave circuit.

16. The method of claim 15, wherein applying a waveform signal to the superconducting circuit comprises applying a waveform signal to each of a plurality of transmission lines of the superconducting circuit, combining waveform signals from outputs of the plurality of transmission lines into a combined output waveform signal; and providing the compensation signal to the combined output waveform signal to mitigate reflections associated with the transmission of signals through the microwave circuit.

17. The method of claim 15, further comprising repeatedly measuring one or more operating parameters associated with operation of the superconducting circuit, adjusting a setting associated with the compensation signal, repeating the measuring of the one or more operating parameters, and the determining if the adjusted setting was more optimal than the previous setting until an optimal setting has been determined, and setting the compensation signal with the optimal setting for normal operation of the superconducting circuit.

18. The method of claim 17, wherein the adjusting the setting comprises adjusting an amplitude of the compensation signal.

19. The method of claim 15, wherein the waveform signal and the compensation signal are set at the same predetermined frequency.

* * * * *

UNITED STATES PATENT AND TRADEMARK OFFICE
CERTIFICATE OF CORRECTION

PATENT NO.       : 9,905,900 B2
APPLICATION NO.  : 14/702044
DATED            : February 27, 2018
INVENTOR(S)      : Quentin P. Herr et al.

Page 1 of 1

It is certified that error appears in the above-identified patent and that said Letters Patent is hereby corrected as shown below:

In the Claims

Column 8, Line 13 In Claim 1, reads "termination" should read --termination resistor--

Signed and Sealed this
Ninth Day of October, 2018

Andrei Iancu
*Director of the United States Patent and Trademark Office*